(12) United States Patent
Sugiyama et al.

(10) Patent No.: US 7,972,961 B2
(45) Date of Patent: Jul. 5, 2011

(54) PURGE STEP-CONTROLLED SEQUENCE OF PROCESSING SEMICONDUCTOR WAFERS

(75) Inventors: Toru Sugiyama, Tama (JP); Ryu Nakano, Tama (JP)

(73) Assignee: ASM Japan K.K., Tokyo (JP)

( * ) Notice: Subject to any disclaimer, the term of this patent is extended or adjusted under 35 U.S.C. 154(b) by 160 days.

(21) Appl. No.: 12/248,741

(22) Filed: Oct. 9, 2008

(65) Prior Publication Data

US 2010/0093181 A1  Apr. 15, 2010

(51) Int. Cl.
*H01L 21/44* (2006.01)
*H01L 21/20* (2006.01)
*C23C 16/00* (2006.01)

(52) U.S. Cl. ..... 438/680; 438/492; 438/493; 427/255.5; 118/719; 257/E21.17; 257/E21.171; 257/E21.585

(58) Field of Classification Search ................... 438/680, 438/492
See application file for complete search history.

(56) References Cited

U.S. PATENT DOCUMENTS

| | | | |
|---|---|---|---|
| 4,828,224 A | 5/1989 | Crabb et al. | |
| 4,889,609 A | 12/1989 | Cannella | |
| 5,186,718 A | 2/1993 | Tepman et al. | |
| 5,286,296 A | 2/1994 | Sato et al. | |
| 5,435,682 A * | 7/1995 | Crabb et al. | 414/217 |
| 5,455,082 A * | 10/1995 | Saito et al. | 427/542 |
| 5,586,585 A | 12/1996 | Bonora et al. | |
| 5,601,686 A | 2/1997 | Kawamura et al. | |
| 5,609,689 A | 3/1997 | Kato et al. | |
| 5,611,655 A | 3/1997 | Fukasawa et al. | |
| 5,647,945 A | 7/1997 | Matsuse et al. | |
| 5,651,868 A | 7/1997 | Canady et al. | |
| 5,784,799 A | 7/1998 | Kato et al. | |
| 5,785,796 A | 7/1998 | Lee | |
| 5,788,778 A | 8/1998 | Shang et al. | |
| 5,810,942 A | 9/1998 | Narayanswami et al. | |
| 5,812,403 A * | 9/1998 | Fong et al. | 700/121 |
| 5,820,692 A | 10/1998 | Baecker et al. | |
| 5,844,195 A | 12/1998 | Fairbairn et al. | |
| 5,879,574 A * | 3/1999 | Sivaramakrishnan et al. | 216/60 |
| 5,913,978 A | 6/1999 | Kato et al. | |

(Continued)

FOREIGN PATENT DOCUMENTS

JP    1992-100222    4/1992

(Continued)

OTHER PUBLICATIONS

European Office Action issued May 4, 2007 in counterpart European Patent Application No. 03 731 267.8.

(Continued)

*Primary Examiner* — Charles D Garber
*Assistant Examiner* — Pape Sene
(74) *Attorney, Agent, or Firm* — Knobbe Martens Olson & Bear LLP

(57) ABSTRACT

A method of processing semiconductor substrates includes: depositing a film on a substrate in a reaction chamber; evacuating the reaction chamber without purging the reaction chamber; opening a gate valve and replacing the substrate with a next substrate via the transfer chamber wherein the pressure of the transfer chamber is controlled to be higher than that of the reaction chamber before and while the gate valve is opened; repeating the above steps and removing the substrate from the reaction chamber; and purging and evacuating the reaction chamber, and cleaning the reaction chamber with a cleaning gas.

8 Claims, 2 Drawing Sheets

U.S. PATENT DOCUMENTS

| | | | |
|---|---|---|---|
| 5,934,856 A | 8/1999 | Asakawa et al. | |
| 5,981,399 A | 11/1999 | Kawamura et al. | |
| 5,993,916 A * | 11/1999 | Zhao et al. | 427/535 |
| 5,997,588 A * | 12/1999 | Goodwin et al. | 29/25.01 |
| 6,042,623 A | 3/2000 | Edwards | |
| 6,048,154 A | 4/2000 | Wytman | |
| 6,106,634 A | 8/2000 | Ghanayem et al. | |
| 6,224,312 B1 | 5/2001 | Sundar | |
| 6,224,679 B1 | 5/2001 | Sasaki et al. | |
| 6,286,230 B1 | 9/2001 | White et al. | |
| 6,312,525 B1 | 11/2001 | Bright et al. | |
| 6,409,837 B1 | 6/2002 | Hillman | |
| 6,488,778 B1 | 12/2002 | Ballantine et al. | |
| 6,536,136 B2 | 3/2003 | Saga | |
| 6,562,140 B1 | 5/2003 | Bondestam et al. | |
| 6,623,798 B2 * | 9/2003 | Shin et al. | 427/248.1 |
| 6,736,146 B2 * | 5/2004 | Liao et al. | 134/1.1 |
| 6,750,155 B2 * | 6/2004 | Halsey et al. | 438/758 |
| 6,828,235 B2 * | 12/2004 | Takano | 438/680 |
| 6,899,507 B2 | 5/2005 | Yamagishi | |
| 7,022,613 B2 | 4/2006 | Pomarede et al. | |
| 7,521,089 B2 * | 4/2009 | Hillman et al. | 427/255.5 |
| 2001/0000759 A1 | 5/2001 | Doley et al. | |
| 2002/0020344 A1 | 2/2002 | Takano | |
| 2003/0044742 A1 * | 3/2003 | Wang et al. | 432/5 |
| 2003/0198741 A1 * | 10/2003 | Uchida et al. | 427/248.1 |
| 2003/0230322 A1 * | 12/2003 | Hillman et al. | 134/11 |
| 2004/0144311 A1 * | 7/2004 | Chen et al. | 118/715 |
| 2004/0144400 A1 * | 7/2004 | Satoh et al. | 134/1.1 |
| 2004/0166697 A1 * | 8/2004 | Wang et al. | 438/795 |
| 2005/0022737 A1 | 2/2005 | Shimizu et al. | |
| 2005/0054196 A1 * | 3/2005 | Wu et al. | 438/680 |
| 2006/0009015 A1 * | 1/2006 | Nakajima et al. | 438/486 |
| 2006/0105548 A1 * | 5/2006 | Kudo et al. | 438/476 |
| 2007/0128863 A1 * | 6/2007 | Ma et al. | 438/680 |
| 2007/0175395 A1 * | 8/2007 | Oh | 118/719 |

FOREIGN PATENT DOCUMENTS

| | | |
|---|---|---|
| JP | 1992-118925 | 4/1992 |
| JP | 05-275519 | 10/1993 |
| JP | 07-142391 | 6/1995 |
| JP | 1995-211761 | 8/1995 |
| JP | 07-273092 | 10/1995 |
| JP | 07-283147 | 10/1995 |
| JP | 1998-270527 | 10/1998 |
| JP | 1999-288992 | 10/1999 |
| JP | 11-330064 | 11/1999 |
| JP | 2003-059997 | 2/2003 |
| WO | WO 01/04935 | 1/2001 |

OTHER PUBLICATIONS

Japanese Office Action issued Mar. 25, 2009 in counterpart Japanese Patent Application No. 2004-508393.

* cited by examiner

Fig. 2

| Operation | | Duration (sec.) |
|---|---|---|
| 1st wafer depo | Depo | 50 |
| | Purge | 20 |
| | Vacuum | 10 |
| Change wafers | | - |
| 2nd wafer depo | Depo | 50 |
| | Purge | 20 |
| | Vacuum | 10 |
| Change wafers | | - |
| 3rd wafer depo | Depo | 50 |
| | Purge | 20 |
| | Vacuum | 10 |
| Remove wafer | | - |
| Reactor cleaning | Cleaning | 200 |
| | Purge | 10 |
| | Vacuum | 10 |
| Total process time (sec.) | | 460 |

Fig. 3

| Operation | | Duration (sec.) |
|---|---|---|
| 1st wafer depo | Depo | 50 |
| | Vacuum | 10 |
| Change wafers | | - |
| 2nd wafer depo | Depo | 50 |
| | Vacuum | 10 |
| Change wafers | | - |
| 3rd wafer depo | Depo | 50 |
| | Vacuum | 10 |
| Remove wafer | | - |
| Reactor cleaning | Purge | 10 |
| | Vacuum | 10 |
| | Cleaning | 200 |
| | Purge | 10 |
| | Vacuum | 10 |
| Total process time (sec.) | | 420 |

PURGE STEP-CONTROLLED SEQUENCE OF PROCESSING SEMICONDUCTOR WAFERS

BACKGROUND

1. Field of the Invention

The present invention relates to sequences of processing semiconductor wafers including deposition processes and cleaning processes, particularly to process sequences involving purge steps.

2. Description of the Related Art

Traditionally, plasma processing apparatuses have been generally used to deposit or remove thin films or modify the surface quality of processing targets. In particular, deposition of thin films on wafers made of silicon, etc., or glass substrates, and etching of thin films deposited on these components, have become basic technologies essential to the production of memories, CPUs and other semiconductor elements as well as liquid crystal displays (LCD). Plasma CVD is a processing method where various material gases are introduced into a reactor that has been evacuated, and then high-frequency power is applied to generate plasma and thereby form various types of thin films on wafers. Typically a plasma CVD processing apparatus is comprised of a reaction chamber, a top high-frequency electrode (shower plate) that also serves as a gas diffusion plate to distribute reactant gases uniformly, and a bottom high-frequency electrode (susceptor heater) that also serves as a susceptor to retain a wafer on top. The reaction chamber is connected to a transfer chamber via a gate valve. A transfer equipment is installed in the transfer chamber for transferring wafers into and out of the reaction chamber.

When a film is deposited onto a substrate, thin films generate in a similar manner inside the reaction chamber as a result of the same chemical reaction and attach to the interior walls of the chamber and surface of the wafer support. As the thin-film deposition process is repeated, these film deposits are accumulated gradually. Finally, the deposits separate from the interior walls and support surface and often float inside the reaction chamber. These floating substances become contaminating impurities that can cause defects in, and lower the yield of, produced semiconductor circuits.

As a way to remove contaminants attached to the interior walls of the reaction chamber, a method is known whereby a cleaning gas is introduced into the semiconductor chamber to break down the deposits into gaseous materials that can then be removed. For example, if the deposits are comprised of silicon oxide or silicon nitride, then $CF_4$, $C_2F_6$, $C_3F_8$ or $NF_3$ is used as this cleaning gas. In this case, the active species of fluorine atoms (fluorine radicals) or active species containing fluorine break down the deposits on the interior walls of the reaction chamber and the resulting impurities are removed as gases.

For use with plasma CVD apparatuses, a method to use the same plasma excitation apparatus used for deposition also for activation of cleaning gas (in-situ plasma cleaning) is known, along with a method to use microwaves to excite plasma to activate $NF_3$ inside the second plasma discharge chamber provided separately and away from the reaction chamber (remote plasma cleaning) (for examples, refer to U.S. Pat. No. 5,788,778 and U.S. Pat. No. 5,844,195).

Under both of these cleaning methods, the gases used for cleaning and deposition react with one another if they are mixed or come in contact, and resultant products generated by these reactions become contaminant sources in the reaction chamber. For example, $SiH_4$ used for deposition and $NF_3$ used for cleaning react with each other strongly if the two gases come in contact. Accordingly, it is necessary to purge or evacuate the reaction chamber to replace the interior of the chamber with nitrogen or other inert gas between the deposition process and the cleaning process.

SUMMARY

However, generation of byproducts caused by contact between the gas used for deposition with the gas used for cleaning, and generation of byproducts in the transfer chamber, etc., due to diffusion of gases remaining inside the reaction chamber, present problems.

To solve these problems, a traditional practice has been to repeat a step of introducing an inert gas (nitrogen, argon, etc.) into the reaction chamber and a step of evacuating the reaction chamber, after the deposition process and also after the cleaning process, in order to exhaust and replace residual gases. However, using these process operations to solve the problem of fine particle deposits on wafers requires a long operation time, which can cause the productivity of the apparatus to drop.

An embodiment of the present invention solves at least one of the aforementioned problems, wherein said embodiment is characterized by one or more of the following:

1) It is characterized in that purge and evacuation is not performed between two deposition processes, but they are performed only between a set of deposition processes and a cleaning process.

2) It is characterized in that purge and evacuation operations are performed in a condition where the wafer has been transferred out of the reactor.

3) It is characterized in that the gate valve opens/closes in a condition where the pressure in the transfer chamber is greater than the pressure in the reactor.

4) It is characterized in that gas that fills the transfer chamber is constituted by an inert gas such as $N_2$ or Ar.

5) It is characterized in that the aforementioned inert gas is supplied into the reaction chamber continuously from the transfer chamber when the gate valve dividing the transfer chamber and reactor is open.

6) It is characterized in that a mechanism is provided whereby the passage connecting the reactor and transfer chamber, as well as the gate valve dividing the two, are maintained at temperatures higher than normal temperatures.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

FIG. 2 is a chart illustrating a sequence of steps for processing multiple substrates and reactor cleaning with purging after each deposition.

FIG. 3 is a chart illustrating a sequence of steps for processing multiple substrates and reactor cleaning in accordance with an embodiment of the invention.

DETAILED DESCRIPTION

Figure 1:
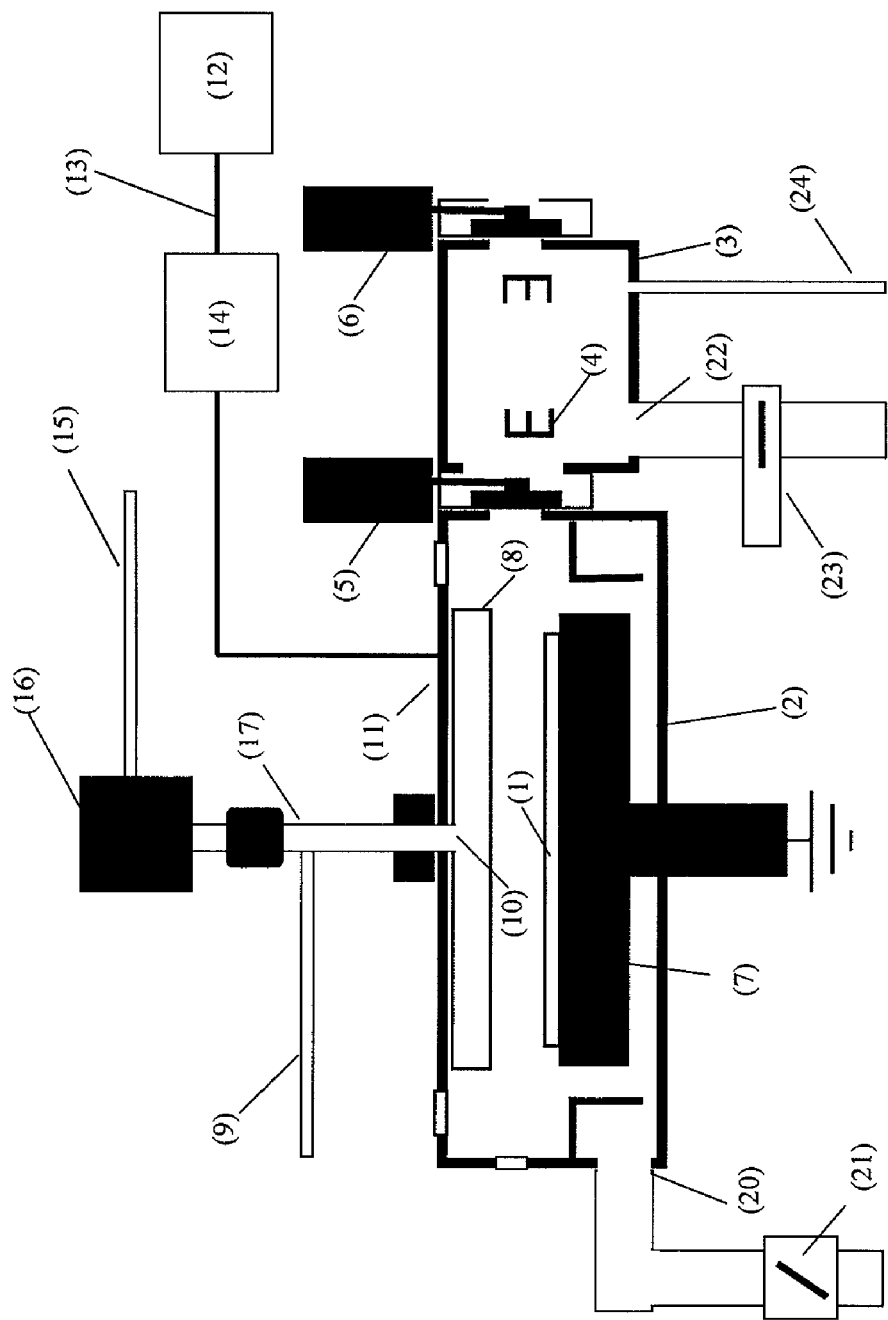
FIG. 1 is a schematic view of a plasma CVD apparatus usable in an embodiment of the present invention.

Embodiments of the present invention are explained in detail below but are not intended to limit the present invention.

In an embodiment, a method is provided for processing semiconductor substrates in an apparatus comprising a reaction chamber and a transfer chamber connected to and communicated with the reaction chamber via a gate valve. The reaction chamber and the transfer chamber are capable of being evacuated. The method includes: (i) depositing a film on a substrate in the reaction chamber; (ii) evacuating the reaction chamber without purging the reaction chamber; (iii) opening the gate valve and replacing the substrate with a next substrate via the transfer chamber wherein the pressure of the transfer chamber is controlled to be higher than that of the reaction chamber before and while the gate valve is opened; (iv) repeating steps (i) and (ii) for the next substrate and removing the next substrate from the reaction chamber; and (v) purging and evacuating the reaction chamber, and cleaning the reaction chamber with a cleaning gas.

In an embodiment, the gate valve may be heated to a degree exceeding any heat passively received from the reaction chamber throughout steps (i) to (iv). In an embodiment, the gate valve may be heated to about 120° C. or higher (e.g, 130° C. to 150° C.), at which temperatures adsorption of gas is inhibited.

In any of the foregoing embodiments, in step (iii), the pressure of the transfer chamber may be controlled before the gate valve is opened by introducing an inert gas into the transfer chamber. In any of the foregoing embodiments, in step (iii), the pressure of the transfer chamber may be controlled while the gate valve is opened by continuously introducing an inert gas into the transfer chamber, which inert gas flows from the transfer chamber into the reaction chamber. In an embodiment, the inert gas may be introduced to the transfer chamber at 2,000 to 4,000 sccm before the gate valve is opened, and at 7,000 to 8,000 sccm while the gate valve is opened.

In any of the foregoing embodiments, in step (v), the purging may be conducted by introducing an inert gas into the reaction chamber at more than 8,000 sccm (e.g., nearly the maximum flow, such as about 10,000 sccm for a typical single wafer reaction chamber).

In any of the foregoing embodiments, the steps (i) to (iii) may be repeated at least once with sequential wafers before step (iv).

In any of the foregoing embodiments, steps (i) to (v) may be repeated until at least 3,000 substrates are processed without ex-situ cleaning. As is known in the art, ex-situ cleaning involves dismantling the reactor and considerable down time and loss of throughput. Accordingly, the ability to save time on purging and yet still avoid excessive frequency of ex-situ cleaning represents a surprising increase in throughput without the expected loss in purity. In an embodiment, the number of particles having a size of 0.2 µm or greater can be controlled to be 30 or less, despite the fact that the purging is conducted only before the cleaning in an embodiment.

Next, embodiments will be explained with reference to drawings, but the drawings are not intended to limit the present invention.

Plasma CVD Apparatus

FIG. 1 shows an example of a semiconductor processing apparatus used to implement the present invention, and this apparatus is explained below. Shown in FIG. 1 is a parallel-plate plasma CVD apparatus, where the apparatus is structured in such a way to perform remote plasma cleaning to clean the processing container.

A wafer (1) is transferred into a processing container (2) retained in a vacuum state, via a transfer chamber (3) that repeatedly switches between a vacuum state and an atmospheric pressure state. Installed in the transfer chamber is a support plate (4) capable of retaining one or more wafers. The reactor and transfer chamber are divided by a gate valve (5), while the transfer chamber and atmosphere are divided by another gate valve (6), where each gate valve opens/closes according to the condition of each internal pressure to permit wafer transfer. Once in the processing container, the wafer is placed onto a resistance-heating type heater/susceptor (7). A shower plate (8) for supplying reactant gases uniformly onto the wafer (1) is installed in a position opposite the susceptor (7). Each reactant gas used in the deposition of film on the surface of the wafer (1) is controlled at a specified flow rate by a mass flow controller (not illustrated), fed through an introduction pipe (9), and introduced from a top opening (10) provided in the processing container (2) to be supplied to the top surface of the shower plate (8). The shower plate (8) has numerous through holes and the gas is supplied uniformly onto the wafer through these holes.

To supply to the shower plate the high-frequency power used to deposit film, an output cable (13) from a high-frequency oscillator (12) is connected to the top section (11) of the processing container (2) via a matching circuit (14).

Cleaning gas, used to clean the deposits from the processing chamber (2), is controlled at a specified flow rate and then introduced into a remote plasma discharge apparatus (16) from a pipe (15). Activated by the remote plasma discharge apparatus (16), the cleaning gas is then introduced to an opening (10) provided in the top section (11) of the processing container (2) through a pipe (17). Next, the activated cleaning gas is introduced into the processing container (2) through the opening (10), and supplied throughout the processing container (2) from the shower plate (8). The processing container (2) is connected to an external vacuum pump (not illustrated) via an opening (20) and a conductance adjustment valve (21). The transfer chamber (3) is also connected to an external vacuum pump (not illustrated) through an opening (22), and evacuated by this pump. A valve (23) that cuts off the transfer chamber and vacuum pump is installed in the evacuation channel, and the transfer chamber can be switched to atmospheric pressure by closing this valve and introducing from a gas line (24) a gas used to restore atmosphere.

In the present disclosure where conditions and/or structures are not specified, the skilled artisan in the art can readily provide such conditions and/or structures, in view of the present disclosure, as a matter of routine experimentation.

The present invention will be explained in detail with reference to specific examples which are not intended to limit the present invention. The numerical numbers applied in specific examples may be modified by a range of at least ±50% in other embodiments, wherein the endpoints of the ranges may be included or excluded.

COMPARATIVE EXAMPLE

FIG. 2 shows the wafer processing sequence used in the comparative example. This example explains a method whereby deposition processes are performed on multiple wafers and then cleaning is performed in a lump. The first wafer is transferred into the reactor and a film is deposited. Thereafter, the gate valve between the reactor and transfer chamber needs to be opened so that the wafer can be transferred out. If constituents of deposition gases remain in the reactor at this time, however, these constituents may flow into the transfer chamber and cause contamination in the transfer chamber or other problems.

Accordingly, steps are incorporated whereby nitrogen gas is used to purge the reactor after the deposition, and then the supply of nitrogen gas is stopped and the gas is exhausted from the reactor, in order to remove residual constituents of deposition gases from the reactor.

After the deposition process on the first wafer has been completed, a deposition process is repeated on the second wafer, and again on the third wafer, in the same manner. When the number of processed wafers exceeds the specified value, a cleaning process is started.

The purge performed after the deposition process on the third wafer also serves to prevent contact between the cleaning gas used in the next step and the residual constituents of deposition gases. If residual constituents of deposition gases are not fully removed before the cleaning gas is introduced, multiple reaction products will generate in the reactor and cause particle generation and other serious problems that will affect the stable operation of the apparatus.

In this example, cleaning is performed after the deposition process on the third wafer. However, the number of wafers to be deposition-processed is not limited to the above. Also, the processing time, processing steps and number of purge/evacuation cycles are not limited, either, to what are used in this example (for example, processing steps can be changed by adding a treatment step before or after deposition, or evacuation can be performed before purge, and so on).

As shown in this comparative example, under the prior art the purge steps are needed to ensure stable operation of the apparatus, which causes the productivity of the apparatus to be sacrificed.

Example

Next, an example of the present invention is explained. FIG. 3 summarizes a wafer processing sequence conforming to the present invention. There is no purge step after deposition, in order to increase productivity. Instead, purge and evacuation steps are added before cleaning.

To prevent the inflow of residual gases into the transfer chamber between deposition processes, which occurred in the comparative example, in this example three mechanisms have been added.

First, the pressure in the transfer chamber is set higher than the pressure in the reactor before the wafer is exchanged between the reactor and transfer chamber.

Second, the sequence has been changed so that nitrogen gas is supplied from the gas line (24) connected to the transfer chamber while the gate valve (5) between the reactor and transfer chamber is open, according to FIG. 1, in order to allow nitrogen gas to flow into the reactor from the transfer chamber continuously.

As the third mechanism, the temperature of the gate valve between the reactor and transfer chamber is raised to 140° C. (by controlling the temperature using a resistance-heating type heater pre-assembled into the gate valve if the apparatus has such heater-assembled gate valve, or if the apparatus does not have such gate valve, by heating the walls of the reactor using the resistance-heating type wall heaters and thermocouples built into the walls and then using the conducted heat to heat the gate valve). Heating is likely to reduce the adsorption of gases onto the gate valve surface and thereby allow residual gases to be purged more quickly.

For your information, under the prior art the gate valve temperature becomes higher than room temperature, even when the gate valve has no built-in heater, because of the heat conducted from the bottom electrode (susceptor heater). In the example of the prior art shown in TABLE 1, for example, the gate valve temperature was 61° C. (for your information, the susceptor heater temperature was set to 390° C., shower plate temperature to 230° C., and reactor wall temperature to 145° C.).

As a mechanism to prevent contact between the cleaning gas and residual constituents of deposition gases, purge and evacuation were implemented before cleaning. Because no wafer is present in the reactor in these steps, it also becomes possible to implement purge at a greater inert gas flow rate and perform evacuation at a higher speed. As a result, efficient, high-speed exhausting of residual gases can be achieved.

As shown in FIG. 3, the first of all the purge step after each deposition was eliminated and the sequence was run by only adding purge and evacuation steps before each cleaning. In this case, white deposits were found in the transfer chamber after continuous processing of 500 wafers, and particles on wafers also increased.

Separately from the above, the sequence shown in FIG. 3 was run by applying the three new mechanisms explained above under the conditions described below. As a result, no deposits were found in the transfer chamber even after processing 3,000 wafers, and the particle deposits on wafers also remained at favorable levels. Similarly, it was confirmed that the number of particles with a grain size of 0.2 μm or more was kept to 30 or less when the same three mechanisms were adopted.

Take note that in an embodiment, only the high-pressure transfer and gate-valve temperature control are performed among the three mechanisms, and the continuous $N_2$ flow is not performed.

Also note that in an embodiment, the reactor pump and load lock pump are both operating while the gate valve is open, and consequently supplying $N_2$ from the transfer chamber side may not necessarily increase the pressure in the transfer chamber, in which case the gas in the transfer chamber may not flow toward the reactor. If this condition occurs, it is necessary to introduce a relatively large amount of gas into the transfer chamber to increase the pressure in the transfer chamber while the gate valve is open. The first mechanism requires that a high pressure is achieved before the gate valve is opened, while the second mechanism requires that there is a flow of nitrogen while the gate valve is open.

In an embodiment, the pressure in the transfer chamber pertaining to the first mechanism is set to a range of 150 to 200 Pa (200 Pa in the above example), while the pressure in the reactor is set to a base level (which is not more than 10 Pa in the above example). The gas used in connection with the first mechanism may be the same as or different from the gas used in connection with the second mechanism, and in addition to nitrogen, Ar, He and other rare gases can also be used. In the above example, nitrogen was used partly because the deposition uses nitrogen and thus negative impact can be minimized, and partly because nitrogen gas can be obtained at low cost.

In an embodiment, the first mechanism is set in such a way that while the gate valve is closed and a high pressure is retained, approx. 2,000 to 4,000 sccm (the exact flow rate range may vary depending on the displacement of the pump) of nitrogen or other inert gas is supplied to control the pressure, while the second mechanism is set in such a way that while the gate valve is open, the two pumps, or namely the reactor pump and load lock pump, are used to implement exhaust and therefore the inert gas flow rate increases to approx. 7,000 to 8,000 sccm±2,000 sccm (7,000 to 8,000 sccm in the above example). In an embodiment, the flow rate of the aforementioned inert gas pertaining to the second mechanism may be equivalent to the flow rate used in the traditional purge step.

As for the conditions of purge implemented before the reactor is cleaned, in the above example (FIG. 3) the purge is performed for 10 seconds by supplying nitrogen at 10,000 sccm. This corresponds to the maximum flow rate, or near the maximum flow rate, achieved on a film deposition apparatus of standard configuration.

When the prior art demonstrated in the comparative example is compared with the example conforming to the present invention, the time needed to deposit a film on three wafers and remove the films deposited on the reactor during the deposition process is shortened from 460 to 420 seconds (representing an improvement of approx. 9%). In a setting where deposition is performed on multiple wafers and then cleaning is performed, the lower the cleaning frequency the greater the improvement in productivity becomes as a result of implementing the sequence shown in this example. If cleaning is performed after deposition on six wafers, for example, an improvement of approx. 20% can be achieved. (It should be noted that, although a typical condition under practical settings is to perform cleaning after deposition on 13 wafers, cleaning needs to be performed after each set of deposition processes, regardless of how many wafers are processed in these deposition processes. For example, the sequence may be repeated like this: "Deposition on 20 wafers"⇒"Cleaning"⇒"Deposition on 20 wafers" ⇒"Cleaning.") Under the method explained in the above example, cleaning was performed after deposition on 13 wafers. However, it was confirmed that no problem occurred when 3,000 wafers were processed continuously according to this setting. No problem was found, either, when cleaning was performed after deposition on 24 wafers before cleaning (however, only 25 wafers were processed continuously according to this setting).

For your information, as a variation of the example it is also possible to apply the same sequence to ALD, PE-ALD and PVD, in addition to PE-CVD as explained above. Also, cleaning need not be remote cleaning and this sequence can also be applied to other cleaning methods, such as $C_2F_6+O_2$ in-situ cleaning (to avoid generation of particles due to contact between $SiH_4$ and $O_2$).

As explained above, at least one embodiment of the present invention can reduce particle deposits on wafers and also enable high-speed purge and evacuation by combining the optimization of the timing at which purge operation is performed, introduction of scavenging gas through the transfer channel, and control of the interior wall temperature in the reaction chamber. By applying at least one embodiment of the present invention, such desired characteristics as stable operation and high productivity can be added to the apparatus.

The skilled artisan will appreciate that the apparatus includes one or more controller(s) (not shown) programmed or otherwise configured to cause the deposition and reactor cleaning processes described elsewhere herein to be conducted. The controller(s) will communicated with the various power sources, heating systems, pumps, robotics and gas flow controllers or valves of the reactor, as will be appreciated by the skilled artisan.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method of processing semiconductor substrates in an apparatus comprising a reaction chamber and a transfer chamber connected to and communicated with the reaction chamber via a gate valve, said reaction chamber and said transfer chamber being evacuatable, said method comprising:
   (i) depositing a film on a substrate in the reaction chamber;
   (ii) evacuating the reaction chamber without purging the reaction chamber between steps (i) and (iii);
   (iii) opening the gate valve and replacing the substrate with a next substrate via the transfer chamber, wherein the pressure of the transfer chamber is controlled to be higher than that of the reaction chamber before and while the gate valve is opened by introducing an inert gas into the transfer chamber while evacuating the transfer chamber and the reaction chamber independently, wherein while the gate valve is open, the inert gas flows from the transfer chamber into the reaction chamber and a flow rate of the inert gas into the transfer chamber is increased, relative to that before the gate valve is opened for replacing the substrate with the next substrate, to 5,000 to 10,000 sccm;
   (iv) repeating steps (i) and (ii) for the next substrate and removing the next substrate from the reaction chamber; and
   (v) after removing the last substrate from the reaction chamber, purging and evacuating the reaction chamber, and cleaning the reaction chamber with a cleaning gas, wherein the purging is conducted by introducing an inert gas into the reaction chamber at a greater flow rate than that used when the last substrate is present in the reaction chamber.

2. The method according to claim 1, wherein the gate valve is heated to a degree exceeding heat passively received from the reaction chamber at least throughout steps (i) to (iv).

3. The method according to claim 2, wherein the gate valve is heated to about 120° C. or higher.

4. The method according to claim 1, wherein in step (iii), the pressure of the transfer chamber is controlled before the gate valve is opened by introducing an inert gas into the transfer chamber.

5. The method according to claim 1, wherein the inert gas is introduced to the transfer chamber at 2,000 to 4,000 sccm before the gate valve is opened, and at 7,000 to 8,000 sccm while the gate valve is opened.

6. The method according to claim 1, wherein in step (v), the purging is conducted by introducing an inert gas into the reaction chamber at more than 8,000 sccm.

7. The method according to claim 1, wherein the steps (i) to (iii) are repeated at least once before step (iv).

8. The method according to claim 1, wherein steps (i) to (v) are repeated until at least 3,000 substrates are processed without ex-situ cleaning.

* * * * *